(12) United States Patent
Lim et al.

(10) Patent No.: US 7,029,999 B2
(45) Date of Patent: Apr. 18, 2006

(54) METHOD FOR FABRICATING TRANSISTOR WITH POLYMETAL GATE ELECTRODE

(75) Inventors: Kwan-Yong Lim, Kyoungki-do (KR); Byung-Seop Hong, Kyoungki-do (KR); Heung-Jae Cho, Kyoungki-do (KR); Jung-Ho Lee, Kyoungki-do (KR); Jae-Geun Oh, Kyoungki-do (KR); Yong-Soo Kim, Kyoungki-do (KR); Se-Aug Jang, Kyoungki-do (KR); Hong-Seon Yang, Kyoungki-do (KR); Hyun-Chul Sohn, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/750,084

(22) Filed: Dec. 30, 2003

(65) Prior Publication Data

US 2004/0266154 A1 Dec. 30, 2004

(30) Foreign Application Priority Data

Jun. 30, 2003 (KR) .................. 10-2003-0043055

(51) Int. Cl.
*H01L 21/4763* (2006.01)
*H01L 21/44* (2006.01)

(52) U.S. Cl. ............... 438/585; 438/592; 438/653; 438/657

(58) Field of Classification Search ........... 438/585, 438/592, 653, 657
See application file for complete search history.

(56) References Cited

U.S. PATENT DOCUMENTS

| 5,739,066 | A | * | 4/1998 | Pan ........................ 438/595 |
| 5,796,151 | A | * | 8/1998 | Hsu et al. ................ 257/410 |
| 6,194,294 | B1 | * | 2/2001 | Lee ......................... 438/585 |
| 6,207,482 | B1 | | 3/2001 | Shih et al. |
| 6,277,722 | B1 | | 8/2001 | Lee et al. |
| 6,291,868 | B1 | * | 9/2001 | Weimer et al. ........... 257/413 |
| 6,503,806 | B1 | * | 1/2003 | Kim ........................ 438/304 |
| 6,800,907 | B1 | * | 10/2004 | Kim et al. ............... 257/356 |
| 2002/0123238 | A1 | | 9/2002 | Powell |
| 2003/0122202 | A1 | | 7/2003 | Kwon |

FOREIGN PATENT DOCUMENTS

JP        61-154169        7/1986

* cited by examiner

*Primary Examiner*—Trung Dang
(74) *Attorney, Agent, or Firm*—Townsend and Townsend and Crew LLP (57) ABSTRACT

The present invention is related to a method for fabricating a transistor with a polymetal gate electrode structure. The method includes the steps of: forming a gate insulation layer on a substrate; forming a patterned gate stack structure on the gate insulation layer, wherein the patterned stack structure includes a polysilicon layer as a bottom layer and a metal layer as an upper layer; forming a silicon oxide-based capping layer along a profile containing the patterned gate stack structure and on the gate insulation layer at a predetermined temperature that prevents oxidation of the metal layer; and performing a gate re-oxidation process.

17 Claims, 7 Drawing Sheets

REOXIDATION

METHOD FOR FABRICATING TRANSISTOR WITH POLYMETAL GATE ELECTRODE

FIELD OF THE INVENTION

The present invention relates to a method for fabricating a transistor with a polymetal gate electrode; and, more particularly, to a method for fabricating a transistor with a polymetal gate electrode through the use of a re-oxidation process free from metal contamination and capable of improving a vertical resistance by suppressing interfacial oxidation of the polymetal.

DESCRIPTION OF RELATED ARTS

Generally, a gate electrode of a metal-oxide semiconductor (MOS) transistor is made of polysilicon. Also, large-scale of integration contributes to micronization of various patterns including a gate electrode. However, it is difficult to apply polysilicon used for the typical gate electrode into a device requiring a rapid operation speed due to high resistivity of the polysilicon, which is a cause for prolonging delay time.

This difficulty is pronounced as a device becomes more highly integrated. Thus, a gate electrode with a polycide structure is formed by using a refractory metal silicide layer such as tungsten silicide, Titanium silicide. One example of the polycide structure is tungsten silicide ($WSi_x$)/polysilicon (Poly-Si).

However, the gate electrode with the polycide structure is still limited to overcome the required rapid operation speed of a highly integrated semiconductor device. Recently, refractory metal such as tungsten (W) is used for the gate electrode. For instance, a polymetal structure such like $W/WN_x$/Poly-Si is used in the gate electrode. The gate electrode structure, i.e., $W/WN_x$/Poly-Si, has a resistance that is about $\frac{1}{10}$ of the resistance of the $WSi_x$/Poly-Si gate electrode structure. The tungsten nitride layer ($WN_x$) of the $W/WN_x$/Poly-Si gate electrode structure is a diffusion barrier layer formed between the upper tungsten (W) layer and the lower polysilicon (Poly-Si) layer.

Typically, a pattern for forming a gate electrode (hereinafter referred to as a gate pattern) is formed by etching stacked layers. Then, the gate pattern is subjected to a re-oxidation process to cure a microtrench formed in a gate oxide layer and a plasma-induced damage. The re-oxidation process performed to the gate pattern oxidizes remnant materials for the gate electrode remaining on a silicon substrate and leads the gate oxide layer to be thickened at edge areas of the gate electrode to form a graded gate oxide (GGO) layer. As a result, reliability of a device may be improved. Despite of these advantages of the re-oxidation process, there is a problem of an abrupt expansion of volume because tungsten is oxidized during the re-oxidation process. Therefore, a conventional selective oxidation technique can be used because it oxidizes polysilicon but not stacked layers of $W/WN_x$.

Figure 1A:
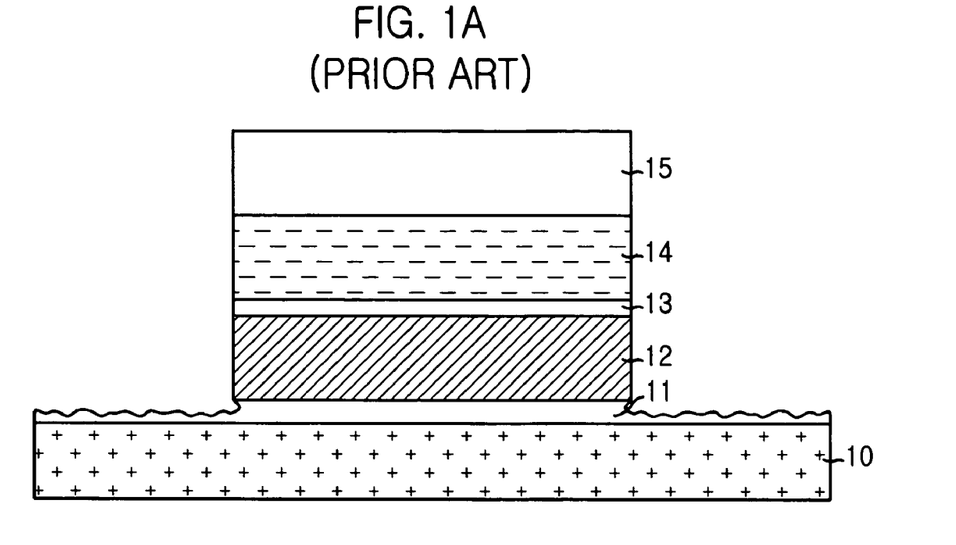
FIGS. 1A and 1B are cross-sectional views of a conventional gate electrode with a stack structure of a tungsten layer, a tungsten nitride layer and a polysilicon layer ($W/WN_x/Poly-Si$) to which a re-oxidation process is applied.
Figure 1B:
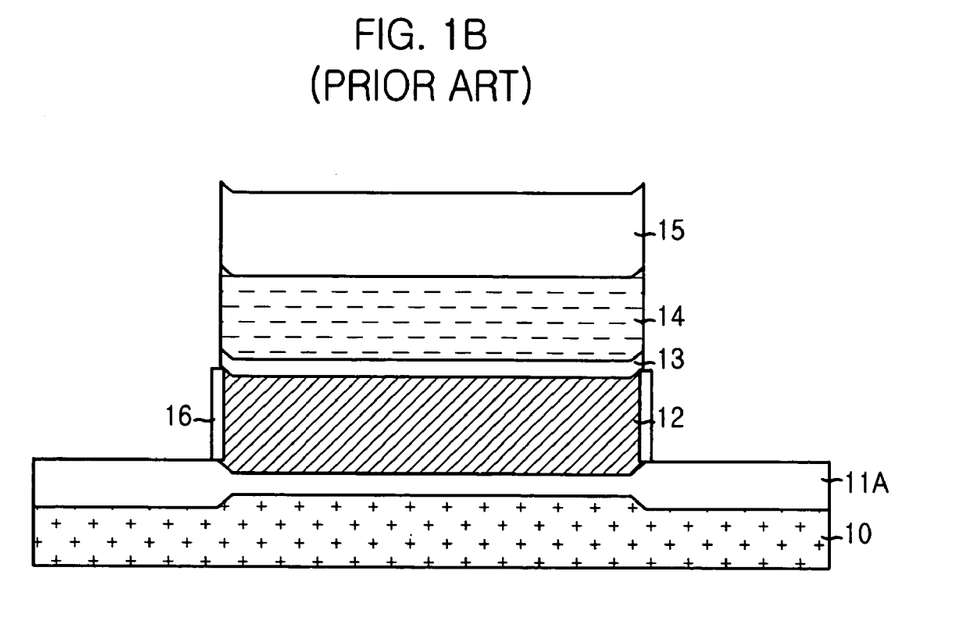

With reference to FIGS. 1A to 1B, a conventional gate electrode structure of $W/WN_x$/Poly-Si and a gate re-oxidation process will be described in detail.

Referring to FIG. 1A, a gate oxide layer 11 is formed on a substrate 10, and a polysilicon layer 12 is deposited thereon. Then, a $WN_x$ layer 13 and a W layer 14 are deposited on the polysilicon layer 12, and a silicon nitride layer 15 is deposited thereon. Herein, the $WN_x$ layer 13 and the W layer 14 function as a diffusion barrier layer. Also, the silicon nitride layer 15 functions as an insulation layer for a hard mask. Hereinafter, the silicon nitride layer 15 is referred to as a hard mask insulation layer. Next, a gate mask is formed, and subsequently, the hard mask insulation layer 15, the W layer 14, the $WN_x$ layer 13 and the polysilicon layer 12 are sequentially etched and are patterned to form a stack structure of the gate electrode.

As shown in FIG. 1A, there are observed microtrenches and plasma-induced damages on a surface of the gate oxide layer 11 exposed during the etching process for forming the gate pattern and at edge areas of a bottom part of the gate pattern.

FIG. 1B shows the gate pattern structure after a selective re-oxidation process is performed. As shown, the microtrenches and plasma-induced damages have been cured, and a gate oxide layer 11A at edge sides of the gate pattern is thickened. Also, the $WN_x$ layer 13 and the W layer 14 are not oxidized, and an oxide layer 16 is formed only at sidewalls of the polysilicon layer 12.

As described above, the selective re-oxidation process is employed to improve device characteristics during the formation of the gate pattern with the polymetal structure. However, the selective re-oxidation process may have several problems. First, the selective re-oxidation process uses $H_2O$ reacting with tungsten (W), and thus, gaseous contaminant $WH_2O_4$ is produced. This gaseous contaminant $WH_2O_4$ may contaminate a wafer and a chamber, impairing subsequent processes and deteriorating device characteristics. In addition to tungsten (W), such metal as molybdenum (Mo), titanium (Ti), tantalum (Ta), ruthenium (Ru), iridium (Ir) and platinum (Pt) used for the polymetal gate electrode structure may have the same problem of contamination. Second, after the selective re-oxidation process, an insulation layer containing silicon oxide ($SiO_x$) and/or silicon nitride ($SiN_x$) is formed with a thickness of above 2 nm at an interfacial surface between the $W/WN_x$ layer and the polysilicon layer. This formation of the insulation layer may increase a vertical resistance of the gate electrode, thereby delaying a signal during a high-frequency operation.

SUMMARY OF THE INVENTION

It is, therefore, an object of the present invention to provide a method for fabricating a transistor with a polymetal gate electrode structure to which a selective re-oxidation process is applied without being affected by metal contaminations.

It is another object of the present invention to provide a method for fabricating a transistor with a polymetal gate electrode structure capable of improving a vertical resistance of the gate electrode by suppressing or blocking oxidation of an interfacial surface between a metal layer and a polysilicon layer during the gate re-oxidation process.

In accordance with an aspect of the present invention, there is provided a method for fabricating a transistor with a polymetal gate electrode structure, including the steps of: forming a gate insulation layer on a substrate; forming a patterned gate stack structure on the gate insulation layer, wherein the patterned stack structure includes a polysilicon layer as a bottom layer and a metal layer as an upper layer; forming a silicon oxide-based capping layer along a profile containing the patterned gate stack structure and on the gate insulation layer at a predetermined temperature that prevents oxidation of the metal layer; and performing a gate re-oxidation process.

In accordance with another aspect of the present invention, there is also provided a method for fabricating a semiconductor device with a polymetal gate electrode structure, including the steps of: forming a gate oxide layer on a substrate; forming a gate stack structure by sequentially stacking and subsequently etching a polysilicon layer, a diffusion barrier layer, a tungsten layer and a hard mask insulation layer on the gate oxide layer; forming a silicon oxide layer on a surface of the gate oxide layer exposed by the etching and along a profile containing the gate stack structure by performing an ALD technique at a predetermined temperature that prevents oxidation of the metal layer; and performing a gate re-oxidation process.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, detailed descriptions on a method for fabricating a metal-oxide semiconductor (MOS) transistor with a polymetal gate electrode structure will be provided in the following with reference to the accompanying drawings.

FIGS. 2A to 2D are cross-sectional views of a MOS transistor with a polymetal gate electrode structure containing stacked layers of tungsten, tungsten nitride and polysilicon ($W/WN_x/Poly-Si$) in accordance with a preferred embodiment of the present invention.

Figure 2A:
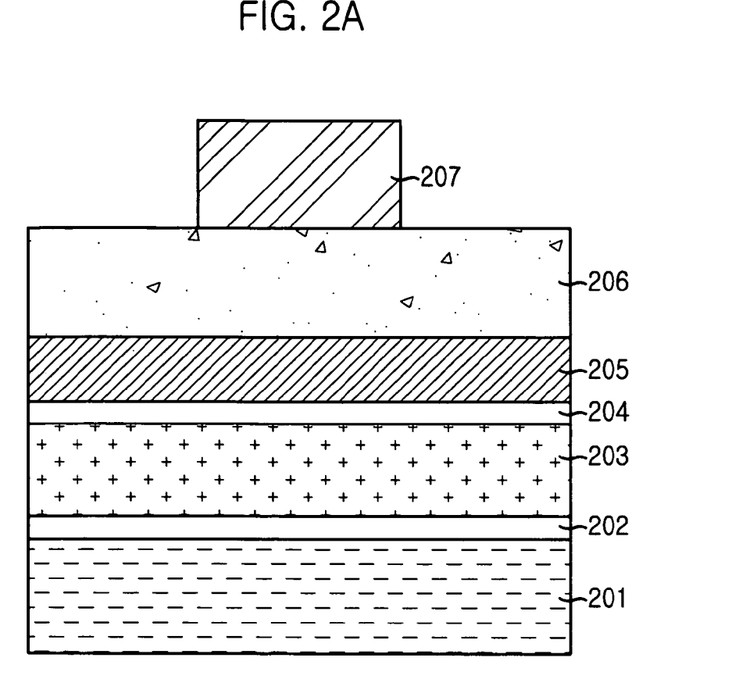
FIGS. 2A to 2D are cross-sectional views of a metal-oxide semiconductor (MOS) transistor with a polymetal gate electrode structure containing stacked layers of $W/WN_x/Poly-Si$ in accordance with a preferred embodiment of the present invention.

Referring to FIG. 2A, a gate oxide layer 202, a polysilicon layer 203, a tungsten nitride (WNx) layer 204, a tungsten (W) layer 205 and a hard mask insulation layer 206 are sequentially formed on a substrate 201 through a deposition and/or growth process. A photoresist pattern 207 for patterning a gate electrode is formed on this stack structure. Herein, the tungsten nitride layer 204 is a diffusion barrier layer.

Figure 2B:
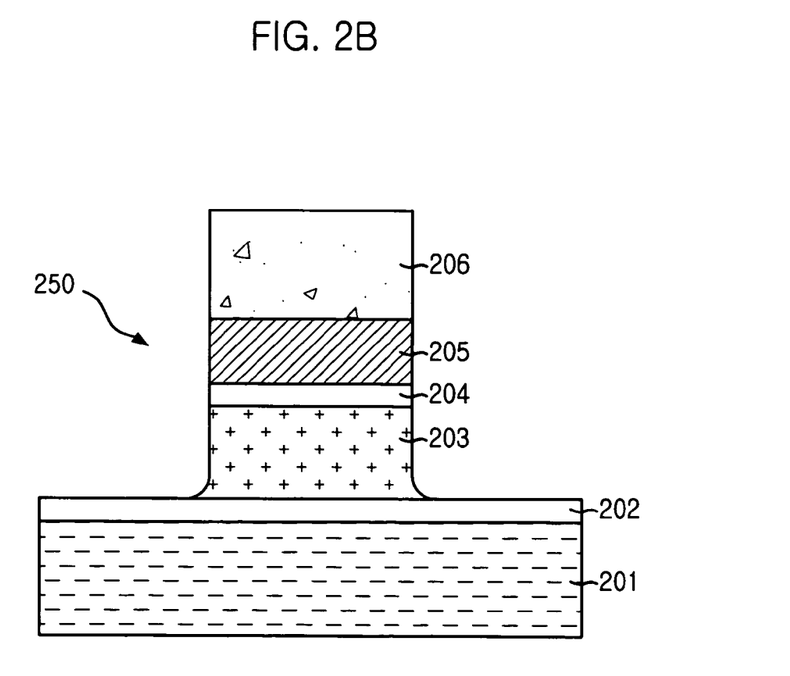

Referring to FIG. 2B, the hard mask insulation layer 206, the tungsten layer 205, the tungsten nitride layer 204 and the polysilicon layer 203 are etched with use of the photoresist pattern 207 as an etch barrier layer so that a stacked gate electrode pattern 250 is formed. At this time, it is preferable to etch the polysilicon layer 203 such that the etched surface of the polysilicon layer 203 is inclined in a positive slope. Damages in the gate oxide layer 202 can be cured by a re-oxidation process. Also, the photoresist pattern 207 is naturally removed in the course of the above etching process or is removed by an additional strip process.

Figure 2C:
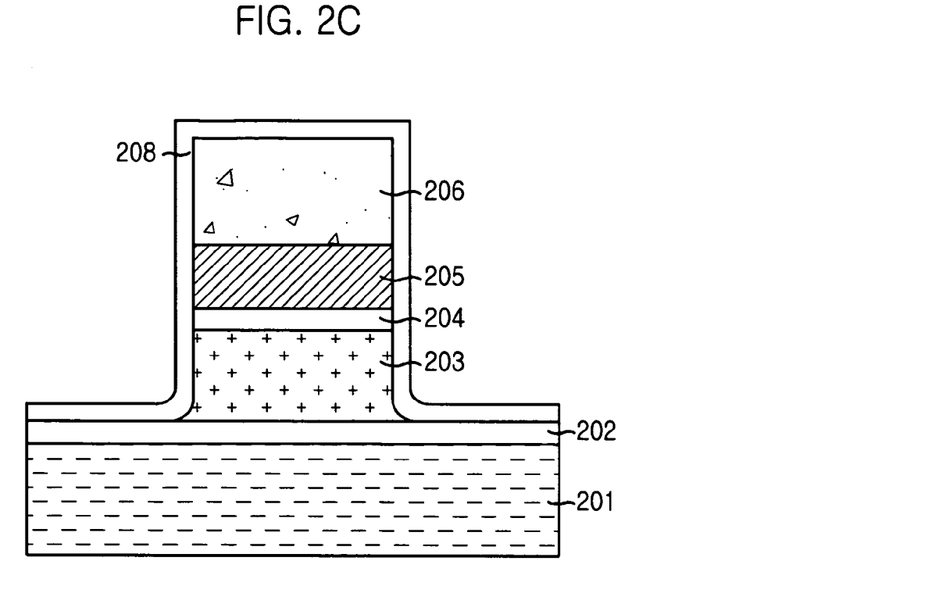

Referring to FIG. 2C, a silicon oxide ($SiO_2$) capping layer 208 is formed along a profile containing the stacked gate electrode pattern 250 and on the exposed gate oxide layer 202 by performing a low temperature process carried out at a temperature ranging from about 70° C. to about 400° C.

The reason for forming the silicon oxide capping layer 208 at a low temperature is to prevent oxidation of the tungsten layer 205. The low temperature process can proceed by employing an atomic layer deposition (ALD) technique, a thermal oxidation technique, a chemical vapor deposition (CVD) technique, a plasma enhanced chemical vapor deposition (PECVD) technique and so on. Among various techniques, the ALD technique is more preferable in an actual practice. The thermal oxidation process is less preferable because it takes a long time to achieve the same effect of the ALD technique due to a condition of a low temperature. The CVD technique is also less preferable since it is difficult to control uniformity of the silicon oxide capping layer 208 formed with a thickness ranging from about 50 Å to about 200 Å. In case that the silicon oxide capping layer 208 is too thick, it is not easy to apply the re-oxidation process. Thus, the silicon oxide capping layer 208 preferably has the thickness ranging from about 50 Å to about 200 Å.

Figure 2D:
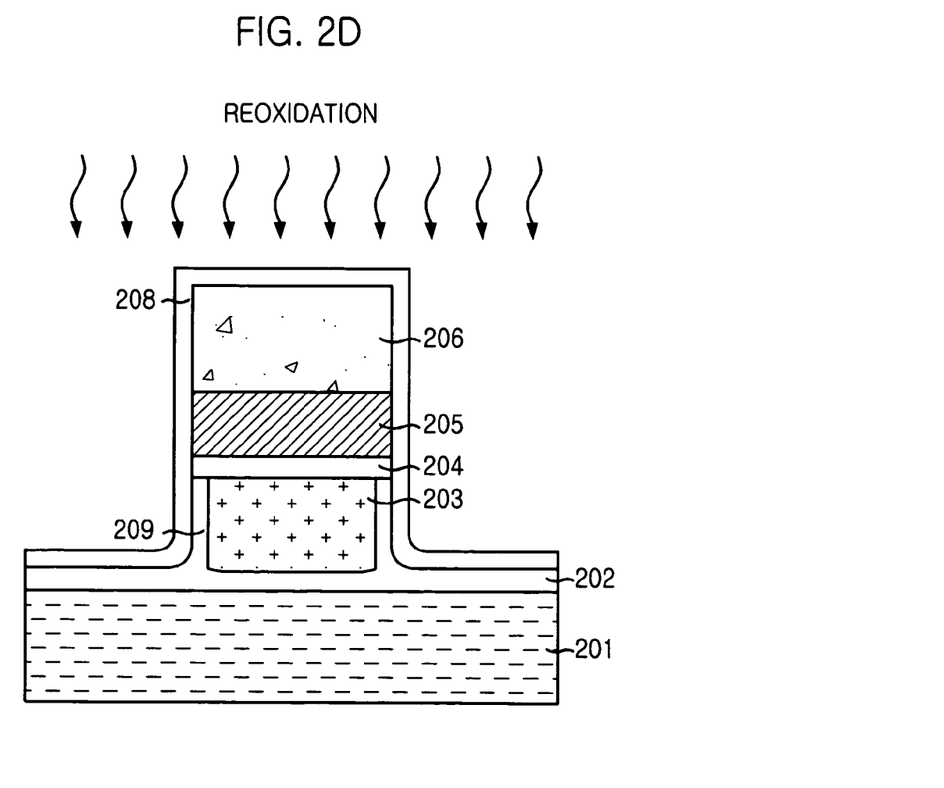

Referring to FIG. 2D, the re-oxidation process is performed to the gate electrode pattern. Hereinafter, this process is referred to as a gate re-oxidation process. After the gate re-oxidation process, an oxide layer 209 is formed at sidewalls of the polysilicon layer 203. Also, the gate oxide layer 202 disposed at each edge side of the gate electrode pattern is thickened through re-growth. The gate re-oxidation process can be performed at a temperature ranging from about 700° C. to about 900° C. by employing a selective re-oxidation process or a typical re-oxidation process. Afterwards, a series of the typical processes for forming a transistor such as a lightly doped drain (LDD) ion-implantation process, a gate spacer formation process, a source/drain ion-implantation process are performed. In the end, a transistor fabrication is completed.

In the preferred embodiment of the present invention, the substrate 201 is made of silicon. However, it is also possible to use an admixture like silicon and germanium or to replace the silicon substrate with a silicon epitaxial layer. Also, an oxide layer or an oxynitride layer can be used for the gate oxide layer 202.

Additionally, it is possible to use a silicon-germanium layer instead of using the polysilicon layer 203. also, in addition to the tungsten layer 205, such metal as molybdenum (Mo), tantalum (Ta), titanium (Ti), ruthenium (Ru), iridium (Ir) and platinum (Pt) can be used. The diffusion barrier layer can be formed with $SiN_x$, $TiAl_xN_y$, $HfN_x$, $zrN_x$, $TaN_x$, $TiN_x$, $AlN_x$, $Tasi_xN_y$, $TiAl_xN_y$ and so on in addition to $WN_x$.

Furthermore, it is also possible to perform a thermal treatment prior to the re-oxidation process. The thermal treatment is for densifying the silicon oxide capping layer 208 and removing impurities formed within the silicon oxide capping layer 208.

Figure 3:
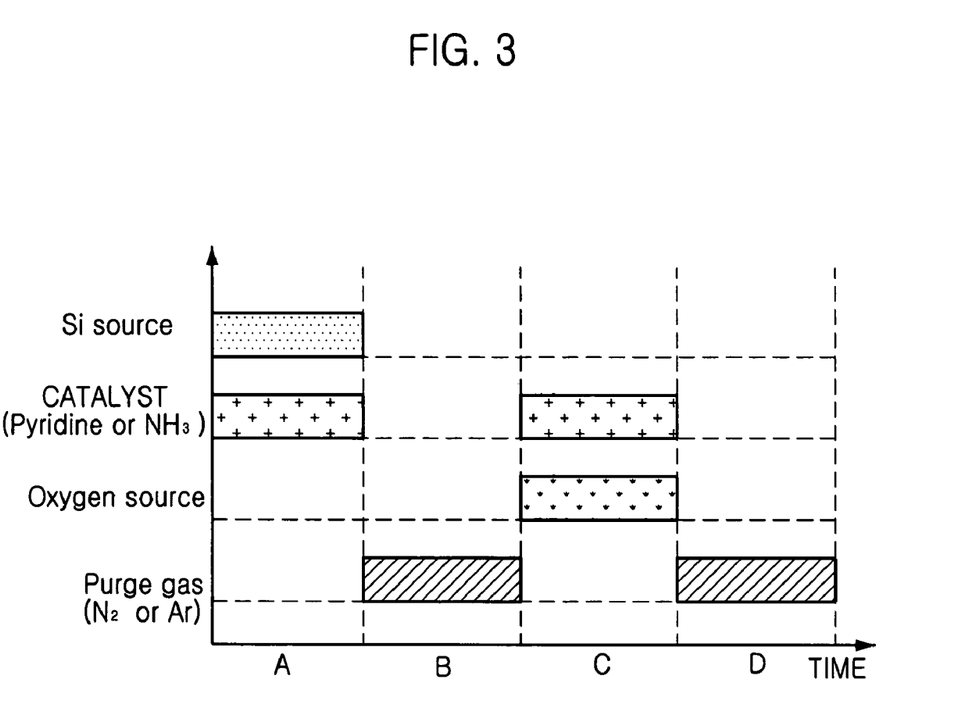
FIG. 3 is a diagram showing procedural steps of a process for forming a silicon oxide ($SiO_2$) layer through the use of an atomic layer deposition (ALD) technique.

FIG. 3 is a diagram showing procedural steps of a process for forming the silicon oxide capping layer 208 through the use of an ALD technique. A wafer including a gate electrode with a stack structure is loaded into a chamber. A source gas of silicon (Si) is flowed into the chamber to form a silicon atomic layer. This section is denoted as A in FIG. 3. Then, the source gas of silicon is purged, and this step is denoted as B. Next, as shown in step C, a source gas of oxygen is flowed into the chamber. Lastly, the source gas of oxygen is purged again in step D.

While the silicon source gas or the oxygen source gas is flowed into the chamber, one of pyridine ($C_5H_5N$) and ammonia ($NH_3$) gas is flowed into the chamber as a catalyst for lowering a process temperature.

One of silicon hexachloride ($SiCl_6$) or silicon tetrachloride ($SiCl_4$) is used as the silicon source gas, and the oxygen source gas is selected from a group consisting of $H_2O$, $O_2$, No, $N_2O$ and a gas obtained by mixing the listed gases.

In order to analyze effects provided by the present invention, a sample is prepared by forming a silicon oxide layer through an ALD technique along a gate electrode pattern with a stack structure containing W/$WN_x$/Poly-Si. At this time, the thicknesses of the silicon oxide layer, the tungsten layer, the tungsten nitride layer and the polysilicon layer are about 75 Å, 650 Å, 50 Å and 700 Å, respectively.

Figure 4:
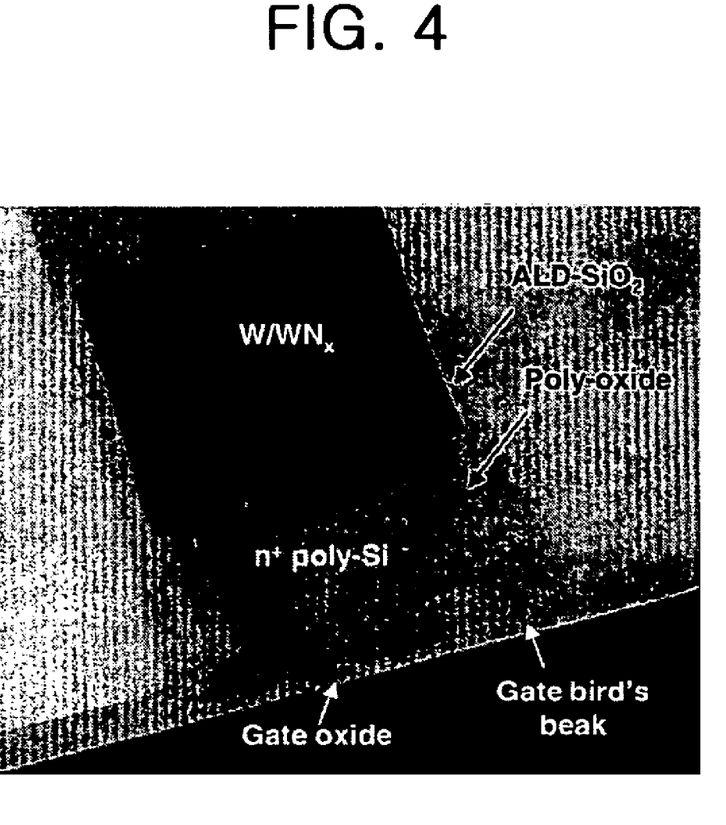
FIG. 4 is a transmission electron microscopy (TEM) photograph showing a cross-sectional view of a sample formed by the preferred embodiment of the present invention.

FIG. 4 is a cross-sectional transmission electron microscopy (TEM) of the sample. As shown, a gate bird's beak is normally generated at each edge sides of the gate electrode without oxidizing the tungsten layer even a selective re-oxidation process proceeds after the formation of the silicon oxide capping layer. Also, it is general that a buffer oxide layer and a spacer made of nitride are additionally formed at sidewalls of a gate electrode in a dynamic random access memory (DRAM) device. However, the silicon oxide capping layer can function as a buffer oxide layer. Thus, the same number of processes is performed without an additional process.

Figure 5:
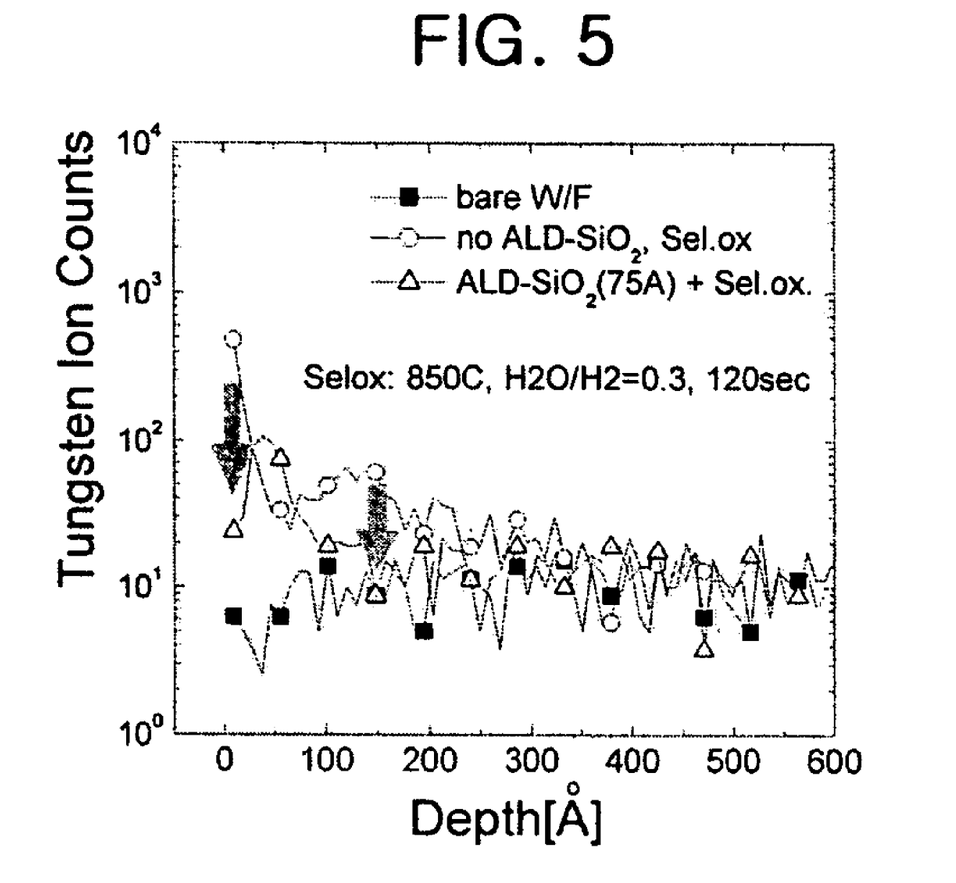
FIG. 5 is a diagram showing secondary ion mass spectrometry (SIMS) of tungsten taken from regions without including a gate electrode in the sample in accordance with the present invention.

FIG. 5 is a diagram showing a second ion mass spectrometry (SIMS) profile of the tungsten taken from regions without the gate electrode region in the sample. In the selective re-oxidation process proceeds after the formation of the silicon oxide capping layer, tungsten contamination is less than that found in a sample without the silicon oxide capping layer. The notation 'selox' means the selective oxidation.

Figure 6:
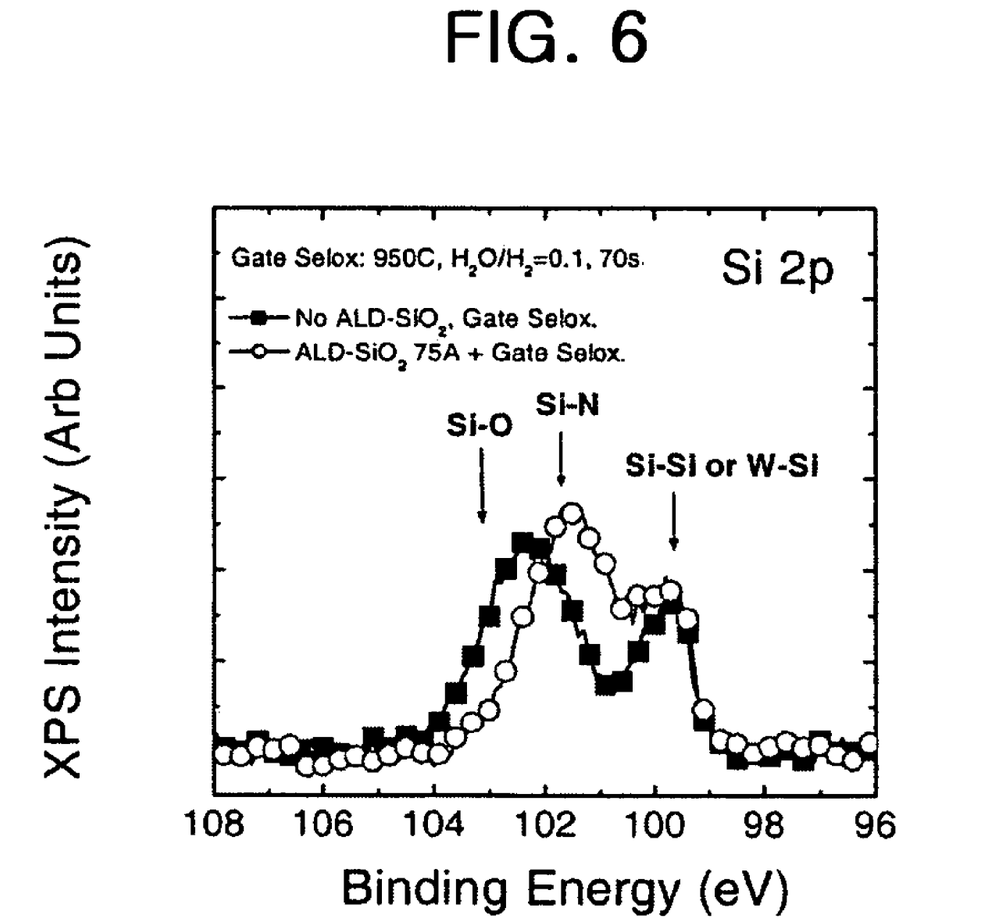
FIG. 6 is a diagram showing analysis data obtained by x-ray photoelectron spectroscopy (XPS) of the sample in accordance with the present invention.

FIG. 6 is a diagram showing analytic data through an x-ray photoelectron spectroscopy (XPS) at an interfacial surface of the sample. The silicon oxide capping layer and the stacked layers W/$WN_x$ are analyzed as they are removed by using wet chemicals. Herein, the silicon oxide capping layer is removed by buffered oxide etchant (BOE), while the W/WNx layers are removed by hydrogen peroxide ($H_2O_2$). At an interfacial surface of the sample, an amount of silicon oxide is significantly reduced due to the fact that the silicon oxide capping layer suppresses oxidation of the interfacial surface. This result further means that a vertical resistance of the gate electrode with the stack structure is improved.

According to the preferred embodiment of the present invention, the selective re-oxidation process can be performed without being affected by metal contaminations. Also, it is possible to suppress oxidation of the interfacial surface between the metal layer and the polysilicon layer to thereby improve a vertical resistance of the gate electrode.

While the present invention has been described with respect to certain preferred embodiments, it will be apparent to those skilled in the art that various changes and modifications may be made without departing from the scope of the invention as defined in the following claims.

What is claimed is:

1. A method for fabricating a transistor with a polymetal gate electrode structure, the method comprising:
   forming a gate insulation layer on a substrate;
   forming a patterned gate stack structure over the gate insulation layer, wherein the patterned stack structure includes a polysilicon layer as a lower layer and a metal layer as an upper layer;
   forming a silicon oxide-based capping layer along a profile containing the patterned gate stack structure and on the gate insulation layer at a predetermined temperature that prevents oxidation of the metal layer, the silicon oxide-based capping layer including a horizontal portion and a vertical portion that together enclose the patterned gate stack structure; and
   performing a gate re-oxidation process,
   wherein the silicon oxide-based capping layer is formed by performing an atomic layer deposition (ALD) technique which includes the steps of:
      loading a wafer containing the patterned gate stack structure into a chamber;
      flowing a source gas of silicon (Si) into the chamber and purging the remaining gas; and
      flowing a source gas of oxygen into the chamber and purging the remaining gas.

2. The method as recited in claim 1, wherein the gate stack structure further includes a diffusion barrier layer in between the polysilicon layer and the metal layer.

3. The method as recited in claim 1, wherein the capping layer is made of one of material selected from a group consisting of $SiO_2$, $SiO_xF_y$ and $SiO_xN_y$.

4. The method as recited in claim 1, wherein the silicon source gas is one of silicon hexachloride ($SiCl_6$) or silicon tetrachloride ($SiCl_4$).

5. The method as recited in claim 1, wherein the oxygen source gas is a gas selected from a group consisting of $H_2O$, $O_2$, NO and $N_2O$ and a gas obtained by mixing the listed gases, wherein the capping layer has a thickness of no more than about 200 Å.

6. The method as recited in claim 4, wherein the Si source gas is flowed into the chamber as simultaneous as one of pyridine ($C_5H_5N$) or ammonium ($NH_3$) gas functioning as a catalyst for lowering a process temperature is flowed thereinto.

7. The method as recited in claim 5, wherein the oxygen source is flowed into the chamber as simultaneous as one of pyridine ($C_5H_5N$) or ammonium ($NH_3$) gas functioning as a catalyst for lowering a process temperature is flowed thereinto.

8. The method as recited in claim 1, wherein the metal layer is made of one material selected from a group consisting of tungsten (W), molybdenum (Mo), tantalum (Ta), titanium (Ti), ruthenium (Ru), iridium (Ir) and platinum (Pt).

9. The method as recited in claim 2, wherein the diffusion barrier layer is formed with a material selected from a group consisting of $WN_x$, $SiN_x$, $TiAl_xN_y$, $HfN_x$, $ZrN_x$, $TaN_x$, $TiN_x$, $AlN_x$, $TaSi_xN_y$, $TiAl_xN_y$.

10. The method as recited in claim 1, wherein the gate stack structure is formed by stacking a tungsten layer, a tungsten nitride layer and a polysilicon layer.

11. A method for fabricating a semiconductor device with a polymetal gate electrode structure, the method comprising:
   forming a gate oxide layer on a substrate;
   forming a gate stack structure by sequentially stacking and subsequently etching a polysilicon layer, a diffusion barrier layer, a tungsten layer and a hard mask insulation layer on the gate oxide layer;

forming a silicon oxide layer on a surface of the gate oxide layer exposed by the etching and along a profile containing the gate stack structure by performing an atomic layer deposition (ALD) technique at a predetermined temperature that prevents oxidation of the barrier layer or tungsten layer, or both; and performing a gate re-oxidation process.

12. The method as recited in claim 11, wherein the silicon oxide layer has a thickness ranging from about 50 Å to about 200 Å.

13. The method as recited in claim 11, wherein the silicon oxide layer is formed by using the ALD technique performed at a temperature ranging from about 70 °C. to about 400° C.

14. The method as recited in claim 11, further comprising the step of carrying out a thermal treatment for densifying the silicon oxide layer and removing impurities contained in the silicon oxide layer after the step of forming the silicon oxide layer.

15. A method for fabricating a semiconductor device, the method comprising:

forming a gate oxide layer on a substrate;

forming a gate stack structure on gate oxide layer, the gate stack structure including a polysilicon layer, a diffusion barrier layer, a metal layer, and a hard mask insulation layer;

forming a silicon oxide layer along a profile of the gate stack structure at a predetermined temperature that prevents oxidation of the barrier layer or metal layer, or both, the predetermined temperature being no more than about 400° C., wherein the silicon oxide layer is formed using an atomic layer deposition (ALD) technique; and performing a gate re-oxidation process after the formation of the silicon oxide layer.

16. The method of claim 15, wherein the silicon oxide layer encloses the gate stack structure.

17. The method of claim 15, wherein the silicon oxide layer is a capping layer that has a thickness of no more than about 200 Å.

* * * * *